US005925886A

United States Patent [19]

Seki et al.

[11] Patent Number: 5,925,886

[45] Date of Patent: Jul. 20, 1999

[54] ION SOURCE AND AN ION IMPLANTING APPARATUS USING IT

[75] Inventors: Takayoshi Seki, Hitachi; Katsumi Tokiguchi, Mito, both of Japan

[73] Assignee: Hitachi, Ltd., Tokyo, Japan

[21] Appl. No.: 08/879,302

[22] Filed: Jun. 19, 1997

[30] Foreign Application Priority Data

Jun. 20, 1996 [JP] Japan .................................... 8-159497

[51] Int. Cl.[6] .................................................. H01J 37/317

[52] U.S. Cl. ................................ 250/492.21; 250/423 R; 315/111.81

[58] Field of Search .......................... 250/492.21, 423 R; 315/111.81, 111.21

[56] References Cited

U.S. PATENT DOCUMENTS 5,625,195 4/1997 Grouillet ............................ 250/492.21

FOREIGN PATENT DOCUMENTS 64-43950 2/1989 Japan .
8-236061 9/1996 Japan .

*Primary Examiner*—Kiet T. Nguyen
*Attorney, Agent, or Firm*—Fay, Sharpe, Beall, Fagan, Minnich & McKee

[57] ABSTRACT

An ion source comprises a discharge chamber; a wave guide transmitting microwave to generate plasma within said discharge chamber; and a matching tube, located between the discharge chamber and the wave guide, the cross-sectional form of which is tapered in the width thereof in the direction of propagation of the microwave.

7 Claims, 3 Drawing Sheets

ION SOURCE AND AN ION IMPLANTING APPARATUS USING IT

BACKGROUND OF THE INVENTION

1. Field of the Invention

The present invention relates to an ion source and an ion implanting apparatus, and more particularly to an ion source with a discharge chamber into which microwave is introduced to induce plasma, and an ion implanting apparatus using the ion source.

2. Description of the Related Art

A microwave ion source is usually composed of a wave guide with the rectangular cross-section for transmitting microwave and a discharge chamber coupled thereto with the circular cross-section. Microwave of the specific frequency (2.45 GHz, for example) is at first generated and then introduced into the discharge chamber through the wave guide to thereby induce plasma therein. An ion beam is taken out from the plasma and irradiated to a sample. Such ion source is applied to an apparatus that changes the surface quality of the sample, processes the sample or implants impurities in the sample.

A conventional ion source of this kind is shown in FIG. 5. As shown in the figure, the ion source has microwave oscillator 1, isolator 2 located after the oscillator 1 for absorbing reflected wave to prevent the oscillator 1 from failing due to the reflected wave, power monitor 3 for measuring the amount of the reflected wave, and three-stub tuner 4 having three rods in a wave guide for providing the impedance matching (load matching) between the plasma and the wave guide of the rectangular cross-section, whereby the microwave is directly supplied from the wave guide **5*b* with the rectangular cross-section to the discharge chamber 6** with the circular cross-section.

In the ion source like this, the impedance between the plasma and the wave guide **5*b* with the rectangular cross-section had to be matched by adjusting the length of rods of the three-stub tuner 4, while monitoring reflected power by the power monitor 3**.

When the maximum current is required in the conventional ion source as described above, ion beam 9 had to be extracted, while adjusting the operational conditions of the ion source, such as a flow rate of sample gas, intensity of the magnetic field applied to the source and the power of microwave. Every time when the operational conditions are changed, the three-stub tuner 4 had to be adjusted so as to minimize the reflected wave, while watching the power monitor 3. Therefore, the very complicated and troublesome manipulation was required, and hence the ion source was difficult to be dealt with.

As a result, there was a problem that it takes time as long as from three days to a week to start up the ion source. Further, there was another problem that an ion source, as well as an ion implanting apparatus using it, becomes large in size, since it must be installed with various kinds of auxiliary devices or equipment. There was still another problem that the adjustment of the source or the apparatus was very dangerous since the voltage as high as 50 kV is applied to the ion source.

SUMMARY OF THE INVENTION

Taking the aforementioned problems in the prior art into consideration, one of the objects of the present invention is to provide an ion source which has less reflected wave even during an ion beam of large current is extracted and can attain the easy adjustment and the start-up in a short time; the ion source being small in size.

Another object of the present invention is to provide an ion implanting apparatus which is small in size and can realize high speed processing using the ion source as mentioned above.

The one object as described above can be attained by an ion source which is provided with a discharge chamber, a wave guide for transmitting microwave to the discharge chamber to induce plasma therein and a matching tube located between the discharge chamber and the wave guide, the cross-sectional form of which changes in the direction of propagation of the microwave.

The another object as described above can be attained by an ion implanting apparatus, which comprises an ion source which induces plasma by using microwave and extracts ions from the induced plasma, a mass separator for separating a specified kind of ions from the ions extracted from the ion source, an accelerating tube for accelerating the specified ions separated by the mass separator up to a predetermined level of energy, lens means for focusing the accelerated specified ions at a desired position, a deflector for removing impurities from the specified ions and deflecting the specified ions in a desired direction, and a process chamber for irradiating the deflected specified ions on a wafer, wherein the ion source has a discharge chamber with a circular cross-section, a wave guide transmitting the microwave into the discharge chamber to induce the plasma therein and a matching tube located between the wave guide and the discharge chamber, the cross-sectional form of which changes in the direction of propagation of the microwave.

BRIEF DESCRIPTION OF THE DRAWINGS

FIGS. 3A to 3D are sectional views of various parts as shown in FIG. 1, wherein FIG. 3A is a sectional view along line A—A in FIG. 1, FIG. 3B that along line B—B, FIG. 3C that along line C—C, and FIG. 3D that along line D—D;

DESCRIPTION OF THE PREFERRED EMBODIMENT

In the following, description will be made of an ion source according to the present invention and an ion implanting apparatus using such ion source, referring to the accompanying drawings.

Figure 1:
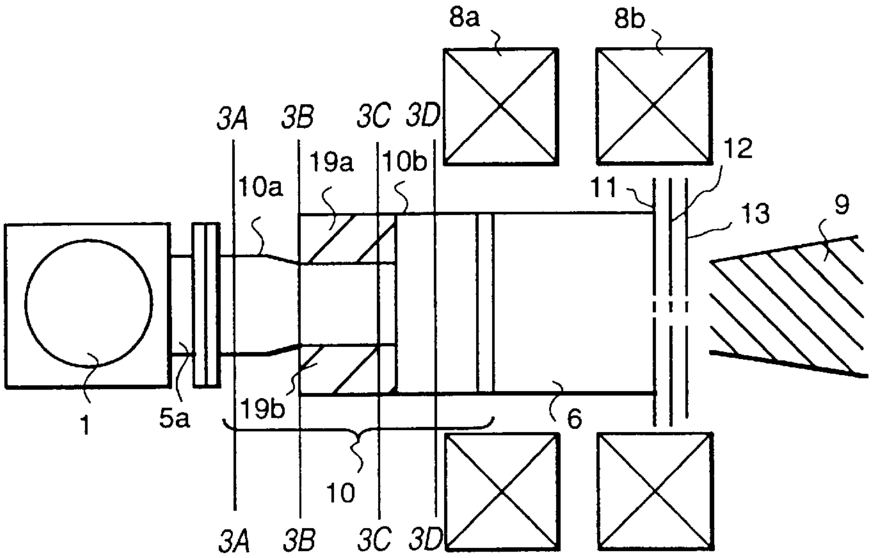
FIG. 1 is a cross-sectional view schematically showing an ion source according to an embodiment of the present invention.

FIGS. 1, 2 and 3A to 3D show an ion source in accordance with a preferred embodiment of the present invention. In FIG. 1, microwave oscillator 1 generates microwave of a specified frequency, for example 2.45 GHz. The oscillator 1 is mechanically supported by wave guide **5*a*** of the rectangular cross-section.

By inserting an antenna rod of the oscillator 1 into the wave guide **5*a*, the microwave generated by the oscillator 1 can be transmitted therethrough. Since, in this embodiment, the wave guide 5*a* has the rectangular cross-section form as shown in FIG. 3**A, it is easy to handle.

As shown in FIG. 1, the microwave generated is led to the discharge chamber 6 through the wave guide **5*a*. In addition, gas is supplied into the discharge chamber 6 through a gas supply port (not shown). Plasma is induced from the supplied gas, when a direct current magnetic field is applied to the chamber 6 by coils 8***a*, 8*b* in the direction of right angle to the electric field of the microwave so as to satisfy the condition of the electron cyclotron resonance (ECR).

From the induced plasma, an ion beam is extracted toward the downstream by the ion extracting electrode system which is composed of acceleration electrode 11, deceleration electrode 12 and earth electrode 13. These electrodes 11, 12, 13 are arranged on the downstream side of the discharge chamber 6 and supported by insulators 14, 15, 16 (cf. FIG. 2), respectively.

The acceleration electrode 11 and the deceleration electrode 12 have a plurality of holes or slits, through which ions can be extracted from the plasma in the discharge chamber 6. Since the electrodes 11, 12 and 13 are heated by the ion beam from the plasma, they are made of heat-resistant metal with the high melting point, such as molybdenum. The insulators 14 to 16 are made of carbon fiber reinforced plastic (FRP) or alumina.

Figures 3A, 3B, 3C, 3D:
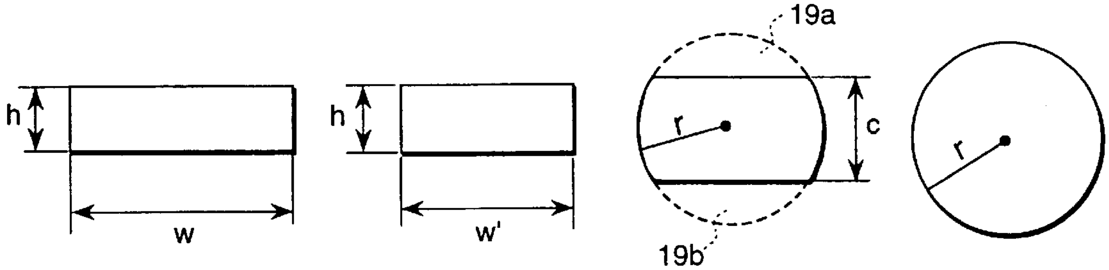
Figure 2:
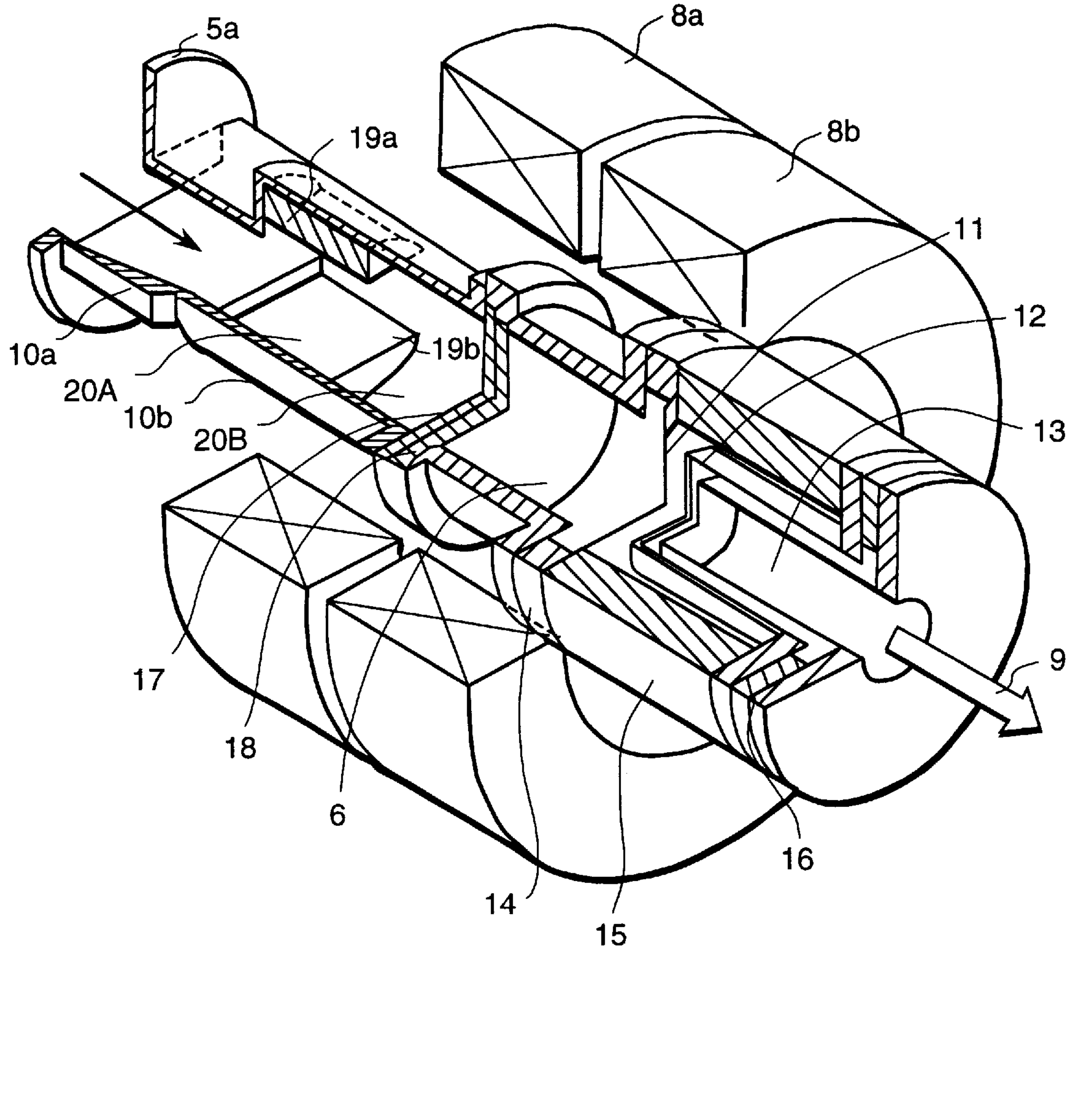
FIG. 2 is a partial cross-sectional view of the ion source as shown in FIG. 1.

The discharge chamber 6 has the cylindrical cross-section along the direction of propagation of microwave, as shown in FIG. 3D, which has an inlet window on the microwave introducing side (cf. left side in FIG. 1 or 2). In this embodiment, the inlet window is composed of first window 17 and second window 18 (cf. FIG. 2).

The first window 17 is made of material including no bubbles, such as quartz, alumina, aluminum nitride or "Vespel" produced by Du Pont, to serve to keep the vacuum of the discharge chamber 6. The second window 18 is made of high heat-resistant material, such as boron nitride, aluminum nitride, to serve to prevent the first window 17 from being injured by plasma induced in the discharge chamber 6 or flushing-back electrons.

The thickness of the first and the second windows 17 and 18 should be at such a value that the transmission of the microwave through the wave guide 5*a* is not prevented, i.e., is so selected that it is less than one fourth of the wave length of the microwave in the wave guide.

Further, if the first window 16 is made of aluminum nitride, it can have both function of the sealing of vacuum and the prevention of damage due to flushing-back electrons. In this case, the second window 17 can be omitted under the consideration of the thickness of the first window 16.

As shown in FIG. 1, impedance matching tube 10 is arranged between the wave guide 5*a* and the discharge chamber 6, which can provide the impedance matching of the microwave and the plasma.

The matching tube 10 is composed of tapered part 10*a* and partial matching part 10*b*, as shown in FIGS. 1 and 2. The tapered part 10*a* has a first cross-sectional form as shown in FIG. 3A on the inlet side of the microwave and a second cross-sectional form as shown in FIG. 3B on the outlet side thereof.

As apparent from FIGS. 3A and 3B, both the first from and the second one of the cross-section have the same height h, but different widths w and w', respectively, wherein w is wider than w'. Namely, the tapered part 10*a* is tapered not in its height, but in its width, and the width thereof is gradually narrowed in the direction on propagation of the microwave. Further, the inlet of the tapered part 10*a* has the same cross-sectional form as that of the outlet of the wave guide 5*a* and is coupled therewith.

The partial matching part 10*b* has an appropriate length in the direction of propagation of the microwave, a first half of which is called an inlet portion 20A (cf. FIG. 2) and communicates with the tapered part 10*a*. A second half of the partial matching part 10*b* is called an outlet portion 20B (cf. FIG. 2) and communicates with the discharge chamber 6.

Basically, the cross-sectional form of the partial matching part 10*b* is cylindrical, as shown by broken lines in FIG. 3C or as shown in FIG. 3D, but there are provided fillers 19*a* and 19*b* on the upper side and on the bottom side in the inlet portion 20A of the partial matching part 10*b*.

The fillers 19*a* and 19*b* have the semicircular cross-section as shown by 19*a*, 19*b* in FIG. 3C, which are arranged within the partial matching part 10*b* so as to be symmetric with respect to the center axis of the partial matching part 10*b* to face their flat surfaces to each other. Accordingly, the cross-section of the inlet portion 20A becomes as shown in FIG. 3C. The fillers 19*a*, 19*b* are made of the same material as the tapered part 10*a* and the partial matching part 10*b*, i.e., of non-magnetic material, such as stainless steel.

Downstream of the inlet portion 20A with the cross-sectional form as shown in FIG. 3C, there exists an outlet portion 20B with the cross-sectional form as shown in FIG. 3D, which is the same form as that of the discharge chamber 6.

As shown in FIGS. 3A and 3C, the width 2*r* of the cross-section of the inlet portion 20A is smaller than the width w of the outlet of the wave guide 5*a*, and the height c of the inlet portion 20A is larger than the height h of the outlet of the wave guide 5*a*. Further, the cross-sectional form as shown in FIG. 3C is formed such that the peripheral length thereof becomes equal to the geometrical mean of the peripheral length of the cross-sectional form as shown in FIG. 3B and that of the cross-sectional form as shown in FIG. 3D.

By way of example, if the frequency of the microwave is 2.45 GHz, and if it is tried to transmit only the basic mode TE11 in the partial matching part 10*b*, using a wave guide as shown in FIG. 3A, wherein w=9.6 cm and h=2.7 cm, the diameter of the cross-section of the outlet portion 20B becomes 7.2 cm to 9.3 cm.

It is assumed here that the diameter of the cross-section of the outlet portion 20B is taken as 8 cm, i.e., 2*r* =8 cm in FIG. 3D and further that the outlet of the tapered part 10*a*, i.e., the coupling part thereof with the partial matching part 10*b*, has the form internally touching with the partial matching part 10*b* as shown in FIG. 3B, wherein the width w=7.5 cm and the height h=2.7 cm, the peripheral length of the cross-section of the inlet portion 20A in the partial matching part lob becomes 22.64 cm. In this case, since the arc portions of the side c in FIG. 3C overlap with the periphery of the cross-section of the outlet portion 20B as shown in FIG. 3D, the length of the side c becomes equal to 4.4 cm.

In the following, description will be done of the operation of the ion source as mentioned above.

The microwave supplied by the oscillator 1 to the wave guide 5*a* is introduced into the discharge chamber 6 through the tapered part 10*a* and the partial matching part 10*b*, whereby plasma is induced in the discharge chamber 6. When the microwave is propagated through the wave guide 5*a*, the tapered part 10*a* and the partial matching part 10*b*, there is the possibility that the reflection of the microwave occurs due to the difference in impedance between the wave guide 5*a* and the matching tube 10.

At this time, the lines of electric force, which are in the direction of the electric field of the microwave, become parallel to each other along the direction of the width of the wave guide 5a, because the wave guide 5a has the rectangular cross-section. Since the tapered part 10a also has the rectangular cross-section, the lines of electric force are parallel to each other in this part, too.

Since, however, the partial matching part 10b has the form with arcing parts in both sides thereof, as shown in FIG. 3C, in the cross-section 20A of its inlet portion, the lines of electric forces near the outside, i.e., in the neighbor of the arcing parts, are curved in the direction opposite to the curvature of the arcing parts so that the lines of electric forces becomes to have a circular form. As a result, there can be provided the impedance matching to prevent the reflection of the microwave from occurring. Since the cross-section 20B of the outlet of the partial matching part 10b is of the same circular as that of the discharge chamber 6, the lines of electric force are further curved so that the microwave can be much more prevented from being reflected.

As described above, since the lines of electric force are gradually curved as the microwave propagates through the partial matching part 10b from its inlet with the cross-section 20A to its outlet with the cross-section 20B, the microwave can be prevented from being reflected. As a result, there becomes no need to provide such plural sheets of dielectric in the inlet window of the discharge chamber that were needed in the prior art.

In addition, the impedance matching can be provided without any impedance adjusting device such as a three-stab tuner. Therefore, any problem that may be caused by using an impedance adjusting device can be solved. Further, microwave and plasma suitable for large current can be generated in the wave guide and the discharge chamber reliably and readily.

According to the embodiment, by employing the matching tube 10 as above, it is possible to connect the microwave oscillator to the discharge chamber by smoothly changing the cross-section from the rectangular form to the circular one, as shown in the figure. As a result, the reflection of microwave can be suppressed less than 25% by only adjusting the condition of the ion source. In a conventional ion source, the reflection of microwave was larger than 60% when an ion beam was extracted without adjusting the three-stub tuner 4. The decrease of the reflected microwave results in less damage in the microwave oscillator 1. At the same time, operation of the ion source becomes easy. Further, the ion source can be shortened by about 55 cm to ½ of that of the conventional ion source, since the three-stub tuner 4, the power monitor 3 and the isolator 2 are not used. Furthermore, since the operation of the ion source is easy, time required for starting-up of the ion source can be shortened to half a day, whereas it has taken a long time from three days to a week in the conventional ion source.

Since the three-stub tuner 4, the power monitor 3 and the isolator 2 are not needed, number of parts and hence cost of the ion source can be reduced as much.

Even in this embodiment, the microwave oscillator 1 may be damaged by a reflected microwave, since the microwave is in a condition of full reflection when no plasma exists (for a very short period of time before the plasma is formed, for example). Although this may not be a serious problem because of the very short period of time, isolator 2 may be installed for the further protection of the microwave oscillator 1.

Instead of the matching tube 10 as above, the same effect as above can be attained by using such a taper wave guide that changes its cross-section from the rectangular to the circular using a taper only, because such can suppress the reflection of microwave, too.

Figure 4:
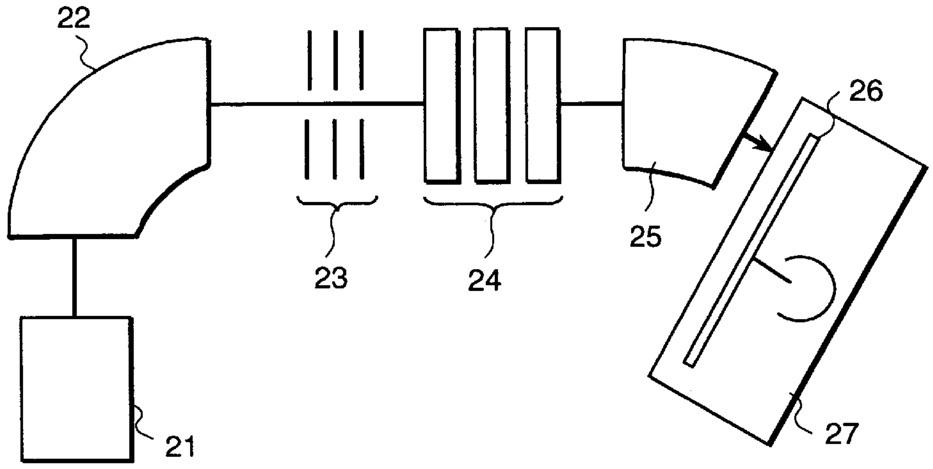
FIG. 4 is a drawing schematically showing a whole structure of an ion implanting apparatus using an ion source according to the embodiment of the present invention.
Figure 5:
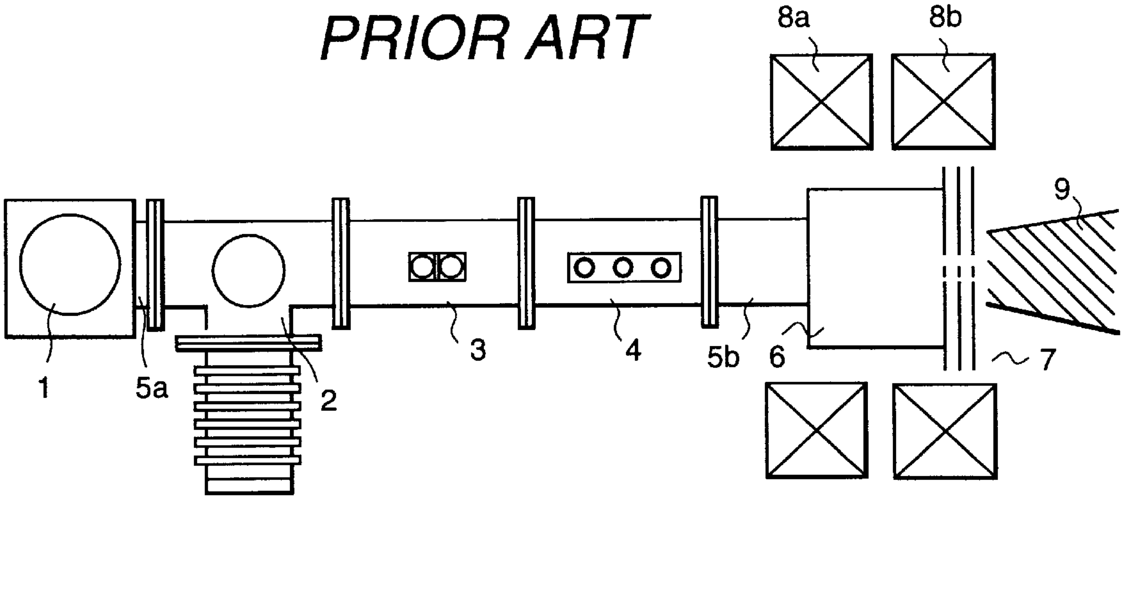
FIG. 5 PRIOR ART
FIG. 5 is a drawing showing a prior art ion source.

FIG. 4 shows an example of an ion implanting apparatus, to which an ion source in accordance with the present invention applied.

The ion implanting apparatus comprises ion source 21 as shown in FIGS. 1 and 2, mass separator 22 for separating and deflecting a specific kind of ions from the ion source 21, rear stage accelerating tube 23 for accelerating the ions passed through the mass separator 22 so as to have a predetermined level of energy, quadrupole lens 24 for focusing the accelerated ions at a desired position, deflector 25 for deflecting the direction of the ion beam, and process chamber 27 for irradiating the specified ions deflected by the deflector 25 on a wafer (not shown) mounted on rotating disk 26.

A lot of ions generated by the ion source 21 are separated into each of specified kinds of ions by the mass separator 22, and only a kind of the specified ions separated are accelerated by the rear stage accelerating tube 23 so as to have a predetermined level of energy. The accelerated ions are focused by the quadrupole lens 24 at a desired position, and impurities contained in the ion beam are removed by deflecting the ion beam by the deflector 25.

Desired processing can be performed on the wafer mounted on the disk 26 rotating around the shaft and placed in the process chamber 27, by irradiating the almost pure ions from which the impurities are removed.

According to this, since the ion source 21, which is well matched in impedance, is used, the ion source 21 is easy to be operated and capable of stably supplying large current ions (larger than 50 mA) to the process chamber 27. Therefore, oxygen ion implanting for producing an SIMOX substrate can be performed in a short processing time within 3 hours, whereas it has taken more than 20 hours in a conventional implanting apparatus.

Although only the ion implanting apparatus has been described as an apparatus using the ion source of microwave discharge type in the embodiment shown in the figure, the ion source can be applied to, for example, a sputtering apparatus for forming a sample in a desired shape by irradiating an ion beam and can stably perform high-speed processing by a large current ion beam.

According to the ion source in accordance with the present invention described above, the ion source comprises a discharge chamber, a wave guide for transmitting microwave to the discharge chamber to induce plasma therein, and a matching tube located between the wave guide and the discharge chamber, the cross-sectional form of which varies in the direction of propagation of the microwave. Therefore, the operation of performing the impedance matching is not required during the starting-up of the ion source. As a result, operation can be easily performed and accordingly the starting-up time can be shortened. Further, the ion source can be made small in size since provision of the three-stub tuner and so on is unnecessary.

Further, according to the ion implanting apparatus in accordance with the present invention, the ion implanting apparatus is constructed using the ion source having the construction described above. Therefore, stable and high-speed processing can be performed with a current as large as never used before.

We claim:

1. An ion source, comprising:

a discharge chamber;

a wave guide transmitting a microwave to generate plasma within said discharge chamber; and a matching tube having a cross-sectional form that gradually varies in a direction of propagation of the microwave.

2. An ion source, comprising:

a discharge chamber;

a microwave oscillator for generating a microwave for creating a plasma within said discharge chamber;

a wave guide, coupled to said microwave oscillator, for transmitting the microwave generated by said microwave oscillator to said discharge chamber;

a matching tube, located between said discharge chamber and said wave guide, said matching tube having a cross-sectional form that gradually varies in a direction of propagation of the microwave.

3. An ion source, comprising:

a discharge chamber with a cross-section of circular form;

a wave guide, with a cross-section of rectangular form, for transmitting a microwave to generate a plasma within said discharge chamber; and a matching tube, located between said discharge chamber and said wave guide, said matching tube having a cross-sectional form of a part of the tube being composed of two straight line parts facing each other and two arcing parts connecting the ends of the two straight line parts.

4. An ion source, comprising:

a discharge chamber with a circular cross-sectional form;

a microwave oscillator for generating a microwave for creating a plasma within said discharge chamber;

a wave guide with a rectangular cross-sectional form, coupled to said microwave oscillator, for transmitting the microwave generated by said microwave oscillator to said discharge chamber;

a matching tube located between said discharge chamber and said wave guide, said matching tube having a rectangular cross-sectional form on a side of said wave guide and a circular cross-sectional form of said discharge chamber, on a side of said discharge chamber, the cross-sectional form of the tube being composed of two straight line parts facing to each other and two arcing parts connecting ends of the two straight line parts.

5. An ion source, comprising:

a discharge chamber;

a microwave oscillator for generating a microwave for creating a plasma within said discharge chamber;

a wave guide, coupled to said microwave oscillator, for transmitting the microwave generated by said microwave oscillator to said discharge chamber;

an isolator for absorbing a reflected wave of the microwave and protecting said microwave oscillator; and a matching tube, located between said discharge chamber and said wave guide, said matching tube having a cross-sectional form that gradually varies in a direction of propagation of the microwave.

6. An ion implanting apparatus comprising:

an ion source for extracting ions from a plasma, which is generated by introducing a microwave into a discharge chamber with a circular cross section;

a mass separator for separating a specified kind of ions from the ions extracted from said ion source;

an accelerating tube for accelerating the specified ions separated by said mass separator up to a predetermined energy;

lens means for focusing the accelerated specified ions at a desired position;

a deflector for removing impurities in the specified ions and deflecting the specified ions in a desired direction; and a process chamber for irradiating the deflected specified ions on a wafer, wherein said ion source comprises a discharge chamber, a wave guide for transmitting a microwave to induce a plasma within said discharge chamber and a matching tube located between said discharge chamber and said wave guide and having a cross section thereof varying in the direction of propagation of the microwave.

7. An ion implanting apparatus comprising:

an ion source for extracting ions from a plasma, which is generated by introducing a microwave into a discharge chamber with a circular cross section;

a mass separator for separating a specified kind of ions from the ions extracted from said ion source;

an accelerating tube for accelerating the specified ions separated by said mass separator up to a predetermined energy;

lens means for focusing the accelerated specified ions at a desired position;

a deflector for removing impurities in the specified ions and deflecting the specified ions in a desired direction; and a process chamber for irradiating the deflected specified ions on a wafer, wherein said ion source comprises a discharge chamber, a microwave oscillator for generating a microwave for inducing a plasma within said discharge chamber, a wave guide coupled to said microwave oscillator for transmitting the microwave generated by said microwave oscillator to said discharge chamber and a matching tube located between said wave guide and said discharge chamber and having the cross section thereof varying in the direction of propagation of the microwave.

* * * * *